(12) United States Patent
Kantipudi et al.

(10) Patent No.: US 11,808,811 B2
(45) Date of Patent: Nov. 7, 2023

(54) APPARATUS AND METHOD FOR REUSING MANUFACTURING CONTENT ACROSS MULTI-CHIP PACKAGES

(71) Applicant: Intel Corporation, Santa Clara, CA (US)

(72) Inventors: Kalyana Kantipudi, San Jose, CA (US); Niraj Vasudevan, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/691,160

(22) Filed: Mar. 10, 2022

(65) Prior Publication Data

US 2023/0288479 A1 Sep. 14, 2023

(51) Int. Cl.
*G01R 31/3183* (2006.01)
*G01R 31/3181* (2006.01)
*G01R 31/317* (2006.01)

(52) U.S. Cl.
CPC ........... *G01R 31/318314* (2013.01); *G01R 31/31713* (2013.01); *G01R 31/31723* (2013.01); *G01R 31/31813* (2013.01)

(58) Field of Classification Search
CPC ...... G01R 31/318314; G01R 31/31713; G01R 31/31723; G01R 31/31813
See application file for complete search history.

(56) References Cited

U.S. PATENT DOCUMENTS

| 8,055,966 | B1* | 11/2011 | Sogani | G11C 29/70 714/733 |
|---|---|---|---|---|
| 2016/0163609 | A1* | 6/2016 | Rahman | H01L 25/0652 257/48 |
| 2018/0340977 | A1* | 11/2018 | Chakraborty | G01R 31/318513 |
| 2021/0116500 | A1* | 4/2021 | Xu | G01R 31/3172 |

* cited by examiner

*Primary Examiner* — Cynthia Britt
(74) *Attorney, Agent, or Firm* — VIERING,JENTSCHURA&PARTNER (57) ABSTRACT

An apparatus includes a daughter die (DD) logic, and an arbitrator connected to the DD logic, and connected to an external testing device and a main die (MD) included in a multi-chip package (MCP). The apparatus further includes an enable logic configured to receive a message from the MD, based on the received message, determine whether the MD or the external testing device is enabled to access the DD logic, and based on the external testing device being determined to be enabled to access the DD logic, control the arbitrator to enable the external testing device to access the DD logic.

20 Claims, 7 Drawing Sheets

APPARATUS AND METHOD FOR REUSING MANUFACTURING CONTENT ACROSS MULTI-CHIP PACKAGES

BACKGROUND

A test solution can enable comprehensive testing of a die, independent of a number of instances of the die and a type of bond out schemes of each instance in a given multi-chip package (MCP), with no or minimal effort on a manufacturing side. This may also enable a low cost and high efficiency rollout of MCPs tailored to specific market needs.

Most current field-programmable gate array (FPGA) packages may be MCPs. FPGA core fabric die(s) and multiple combinations of daughter dies (DDs) can be assembled with advanced embedded multi-die interconnect bridge (EMIB)-based 2.5-dimensional packaging technologies. These DDs may have transceivers supporting various communication protocols, digital-to-analog converters (DACs) for radio frequency (RF) communication and silicon photonics interfaces for optical communication. To reduce research and development cost and time-to-market of an FPGA device, there may be an increased need to include the same transceiver die in multiple current and future (not yet defined) packages. Depending on a target market and a package footprint, a number of available input/output (I/O) links in each die can also vary through downbonding in a package, further challenging an ability to reuse high volume manufacturing (HVM) test content.

Previous solutions involved accessing DDs through an FPGA fabric, and retargeting and redeveloping test patterns for every new package, based on a number of instances of a DD in that package and on a number of I/O links downbonded out. These solutions may have taken significant resourcing on a manufacturing side to develop and bring up tests for each new package. The previous solutions may also significantly impact an ability to rollout multiple MCPs in parallel without significant resource investments.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the present disclosure. The dimensions of the various features or elements may be arbitrarily expanded or reduced for clarity. In the following description, various aspects of the present disclosure are described with reference to the following drawings, in which.

DETAILED DESCRIPTION

The following detailed description refers to the accompanying drawings that show, by way of illustration, specific details and aspects in which the present disclosure may be practiced. These aspects are described in sufficient detail to enable those skilled in the art to practice the present disclosure. Various aspects are provided for devices, and various aspects are provided for methods. It will be understood that the basic properties of the devices also hold for the methods and vice versa. Other aspects may be utilized and structural, and logical changes may be made without departing from the scope of the present disclosure. The various aspects are not necessarily mutually exclusive, as some aspects can be combined with one or more other aspects to form new aspects.

The present disclosure generally relates to an apparatus and a method for reusing manufacturing content across MCPs.

A present apparatus may include a daughter die (DD) logic, and an arbitrator connected to the DD logic, and connected to an external testing device and a main die (MD) included in a multi-chip package (MCP). The apparatus further includes an enable logic configured to receive a message from the MD, based on the received message, determine whether the MD or the external testing device is enabled to access the DD logic, and based on the external testing device being determined to be enabled to access the DD logic, control the arbitrator to enable the external testing device to access the DD logic.

In another aspect, an apparatus pursuant to the present disclosure may include a processor configured to, based on the apparatus being enabled to access a daughter die (DD) logic of one of DDs included in a multi-chip package (MCP), obtain information of the MCP in which one or more input/output (I/O) links included in the DD logic are unused, and create a test pattern for testing the MCP, based on the obtained information of the MCP. The processor may be further configured to update the created test pattern by masking, in the created test pattern, the unused one or more I/O links, and send, to the DD logic, the updated test pattern for testing the DD logic.

In yet another aspect, a present method may include receiving, by a daughter die (DD) included in a multi-chip package (MCP), a message from a main die (MD) included in the MCP, and based on the received message, determining, by the DD, whether the MD or an external testing device is enabled to access a DD logic included in the DD. The method may further include, based on the external testing device being determined to be enabled to access the DD logic, enabling, by the DD, the external testing device to access the DD logic.

The above-described aspects may enable reuse of manufacturing content or test content across various test platforms for any MCP. In detail, an independent test harness is built in each DD of the MCP, which can be made accessible during test, while securing or locking that access from external testing devices in mission modes. Constructed test patterns may be reused as-is in any future MCP HVM test program. This can enable little to no effort in bringing up HVM test patterns in future MCPs, which may enable manufacturing to rollout multiple MCPs in parallel.

Figure 1A:
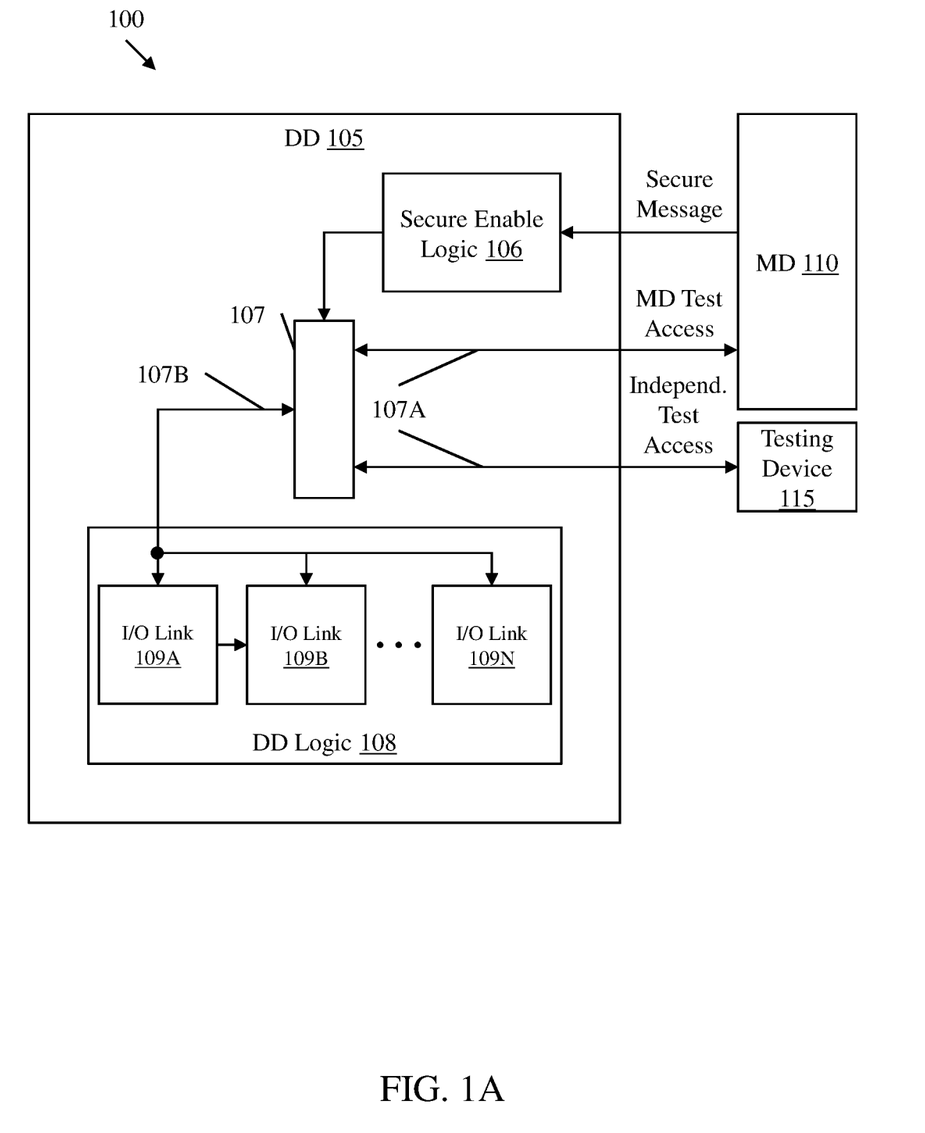
FIG. 1A is a block diagram of a system for reusing manufacturing content across MCPs, the system including secure independent test access enablement, according to aspects of the present disclosure.

FIG. 1A is a block diagram of a system 100 for reusing manufacturing content across MCPs, the system 100 including secure independent test access enablement, according to aspects of the present disclosure.

Referring to FIG. 1A, the system 100 includes a DD 105 and a main die (MD) 110 of an MCP, and a testing device 115. The DD 105 includes a secure enable logic 106, an arbitrator 107 and a DD logic 108. The DD logic 108 includes I/O links 109, which may include an I/O link 109A, an I/O link 109B, . . . and an I/O link 109N. Although 3 I/O links are shown, this is only an example, and the I/O links 109 may include any number of I/O links.

The DD 105 further includes an MD test access for the MD 110 to access and test the DD logic 108, namely, the I/O links 109 including semiconductor intellectual property (IP) cores with I/O test pins accessible to the MD 110. The MD test access can include a set of pins connected to the MD 110. A default mission mode of the DD 105 may allow only the MD 110 to access the DD logic 108 for testing of the DD logic 108.

The DD 105 further includes an independent test access for the testing device 115 (e.g., a manufacturing tester, a dedicated test bin, and a user I/O interface) to access and test the DD logic 108, namely, the I/O links 109 including the semiconductor IP cores with the I/O test pins accessible to the testing device 115. The independent test access can include one or more separate sets of pins and/or one or more Y-connections or sets of pins that are shared with other DDs in the MCP and/or the external testing device 115. Pre-defined test modes of the DD 105 may allow independent access of the DD logic 108 for testing the DD logic 108.

The MD test access and the independent test access are respectively connected to input/output pins 107A of the arbitrator 107 that is controlled or gated by the secure enable logic 106, and the DD logic 108 is connected to input/output pins 107B of the arbitrator 107. In detail, the secure enable logic 106 receives a secure message from the MD 110, the secure message indicating whether the DD 105 is in the default mission mode or a predefined test mode. Based on the received secure message, the secure enable logic 106 may further control the arbitrator 107 to enable the MD 110 to access the DD logic 108 via the MD test access, or to enable the testing device 115 to access the DD logic 108 via the independent test access. In other words, based on the received secure message, the secure enable logic 106 can unlock the MD test access or the independent test access. The secure enable logic 106 may include a firmware that is not accessible to external users.

The system 100 may allow more test and debug access to the DD logic 108 than a regular test and debug access through the MD 110 in the default mission mode.

Figure 1B:
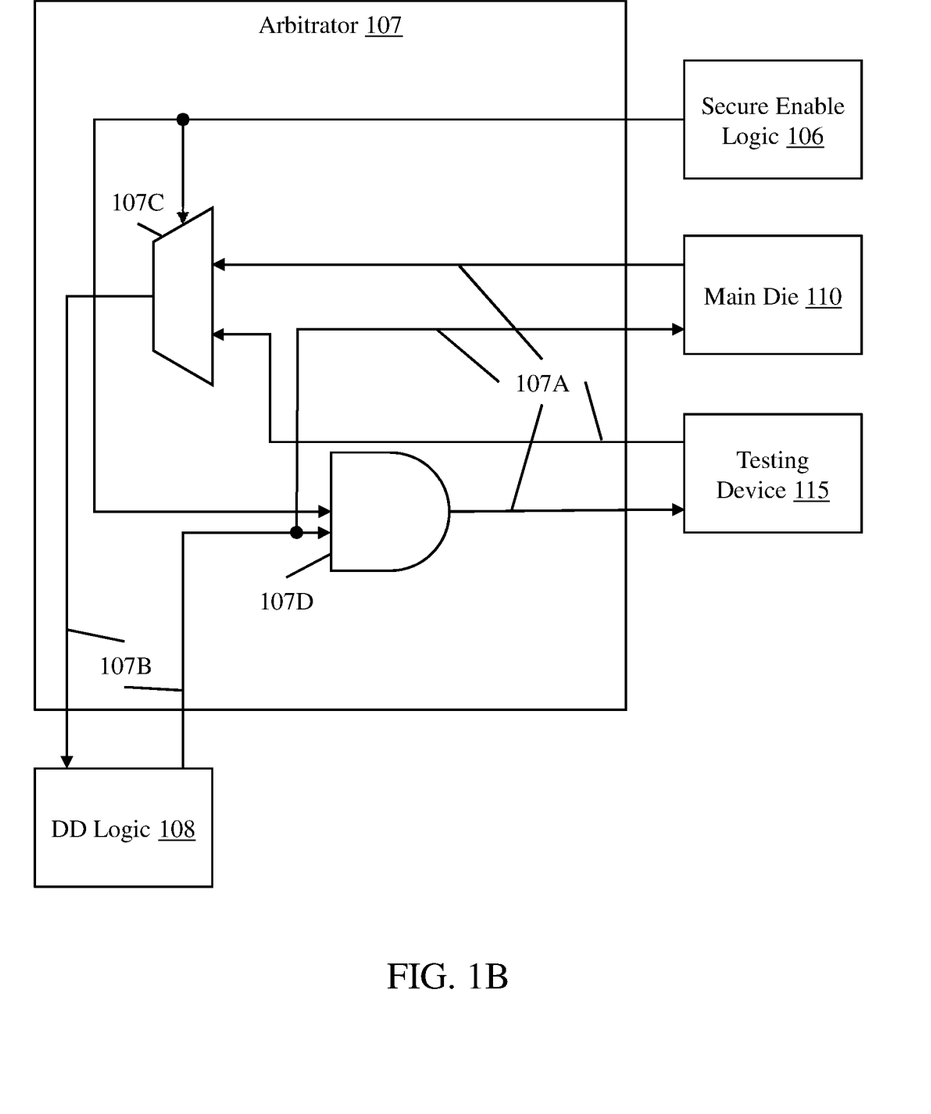
FIG. 1B is a block diagram of an arbitrator included in the system of FIG. 1A.

FIG. 1B is a block diagram of the arbitrator 107 included in the system 100 of FIG. 1A.

Referring to FIG. 1B, the arbitrator 107 may include the input/output pins 107A and 107B, a multiplexer 107C and an AND gate 107D. This is only an example, and other logic gates besides the multiplexer 107C and the AND gate 107D may instead be used in the arbitrator 107.

The secure enable logic 106 controls the multiplexer 107C to select or enable the MD 110 to input a test pattern into the DD logic 108, or to select or enable the testing device 115 to input a test pattern into the DD logic 108, via the input pins 107A and 107B. The secure enable logic 106 further controls the AND gate 107D to enable the testing device 115 to receive a test response from the DD logic 108, via the output pins 107A and 107B, or to block the testing device 115 from receiving the test response from the DD logic 108.

Figure 2:
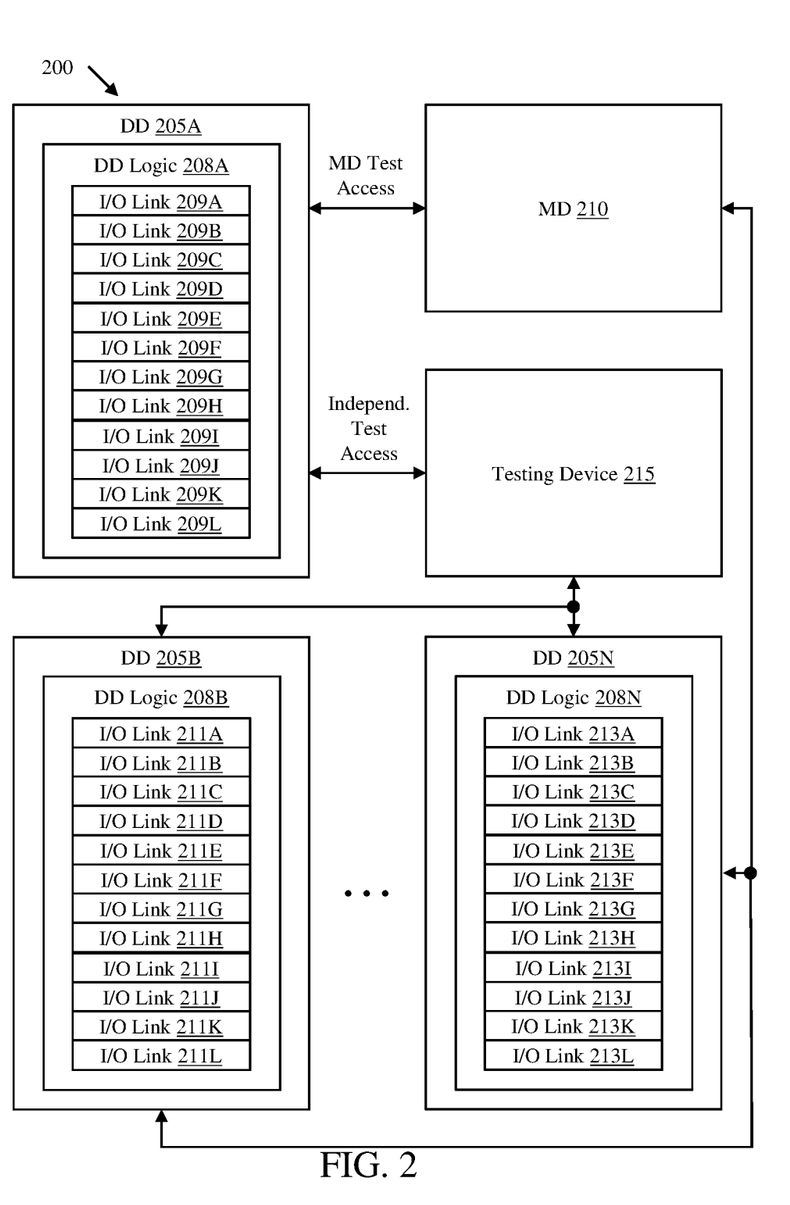
FIG. 2 is a block diagram of a system for reusing manufacturing content across MCPs, the system including n DDs, according to other aspects of the present disclosure.

FIG. 2 is a block diagram of a system 200 for reusing manufacturing content across MCPs, the system 200 including n DDs 205, according to other aspects of the present disclosure.

Referring to FIG. 2, the system 200 includes the DDs 205 and the MD 210 of an MCP, and a testing device 215. The DDs 205 may include a DD 205A, a DD 205B, . . . and a DD 205N. Although 3 DDs are shown, this is only an example, and the DDs 205 may include any number of DDs.

The DDs 205 respectively include DD logics 208. The DD logics 208 may include a DD logic 208A, a DD logic 208B, . . . and a DD logic 208N respectively corresponding to the DD 205A, the DD 205B, . . . and the DD 205N. Each of the DD logics 208 includes I/O links 209, 211 or 213, which can include semiconductor IP cores with I/O test pins accessible to the MD 210 and the testing device 215. In this example, each of the DD logics 208 may include 12 I/O links, but this is only an example, as each of the DD logics 208 can include any number of I/O links. As shown in FIG. 2, the DD logic 208A may include I/O links 209A to 209L, the DD logic 208B may include I/O links 211A to 211L and the DD logic 208N may include I/O links 213A to 213L.

An expectation of any manufacturing test content or pattern that is generated for one or more DDs may be that the test pattern needs to be able to execute as is (without needing any test pattern regeneration) on any future MCPs that are not yet defined. To achieve this, a user can define a virtual MCP including n DDs, with an assumption that any of m links in each of the DDs may be downbonded out, e.g., unused, not needed, unexposed to a user, and/or powered off. A granularity of this downbonding assumption can vary depending on a type of the DDs and a type of the virtual MCP.

FIG. 2 shows a high-level representation of a virtual MCP including the n DDs 205, each including them (e.g., 12) I/O links 209, 211 or 213. A number of the I/O links 209, 211 or 213 that are downbonded in each of the DDs 205 can vary. Attributes of the virtual MCP may be included and/or user-entered in a test program that is initially-loaded into the testing device 215.

The testing device 215 may initially and automatically generate and simulate all manufacturing test content for a single DD. Then, the testing device 215 can mirror the manufacturing test content n times for the n DDs 205 to create a test pattern for the virtual MCP. The testing device 215 may send, via an unlocked independent test access, the created test pattern to the actual MCP (e.g., the DDs 205) for testing the DD logic 208, namely, the I/O links 209, 211 and 213. The testing device 215 may further receive, via the unlocked independent test access, a test response from the I/O links 209, 211 and 213.

Table 1 shows the created test pattern for the virtual MCP. The test pattern is executable on each of the DDs 205 and on each set of the I/O links 209, 211 and 213 in a respective one of the DDs 205. Each of the I/O links 209, 211 and 213 includes an input test pin for receiving a stimulus (e.g., the created test pattern from the testing device 215), and an output test pin for sending a response back to the testing device 215.

TABLE 1

| | DD 205A Input Test Pin | DD 205A Output Test Pin | DD 205B Input Test Pin | DD 205B Output Test Pin | ... | DD 205N Input Test Pin | DD 205N Output Test Pin |
|---|---|---|---|---|---|---|---|
| I/O Link A | 1 | H | 1 | H | ... | 1 | H |
| I/O Link A | 1 | L | 1 | L | ... | 1 | L |
| I/O Link B | 1 | H | 1 | H | ... | 1 | H |
| I/O Link B | 1 | L | 1 | L | ... | 1 | L |
| I/O Link C | 1 | H | 1 | H | ... | 1 | H |
| I/O Link C | 1 | L | 1 | L | ... | 1 | L |
| I/O Link D | 1 | H | 1 | H | ... | 1 | H |
| I/O Link D | 1 | L | 1 | L | ... | 1 | L |
| I/O Link E | 1 | H | 1 | H | ... | 1 | H |
| I/O Link E | 1 | L | 1 | L | ... | 1 | L |
| I/O Link F | 1 | H | 1 | H | ... | 1 | H |
| I/O Link F | 1 | L | 1 | L | ... | 1 | L |
| I/O Link G | 1 | H | 1 | H | ... | 1 | H |
| I/O Link G | 1 | L | 1 | L | ... | 1 | L |
| I/O Link H | 1 | H | 1 | H | ... | 1 | H |
| I/O Link H | 1 | L | 1 | L | ... | 1 | L |
| I/O Link I | 1 | H | 1 | H | ... | 1 | H |
| I/O Link I | 1 | L | 1 | L | ... | 1 | L |
| I/O Link J | 1 | H | 1 | H | ... | 1 | H |
| I/O Link J | 1 | L | 1 | L | ... | 1 | L |
| I/O Link K | 1 | H | 1 | H | ... | 1 | H |
| I/O Link K | 1 | L | 1 | L | ... | 1 | L |
| I/O Link L | 1 | H | 1 | H | ... | 1 | H |
| I/O Link L | 1 | L | 1 | L | ... | 1 | L |

Figure 3:
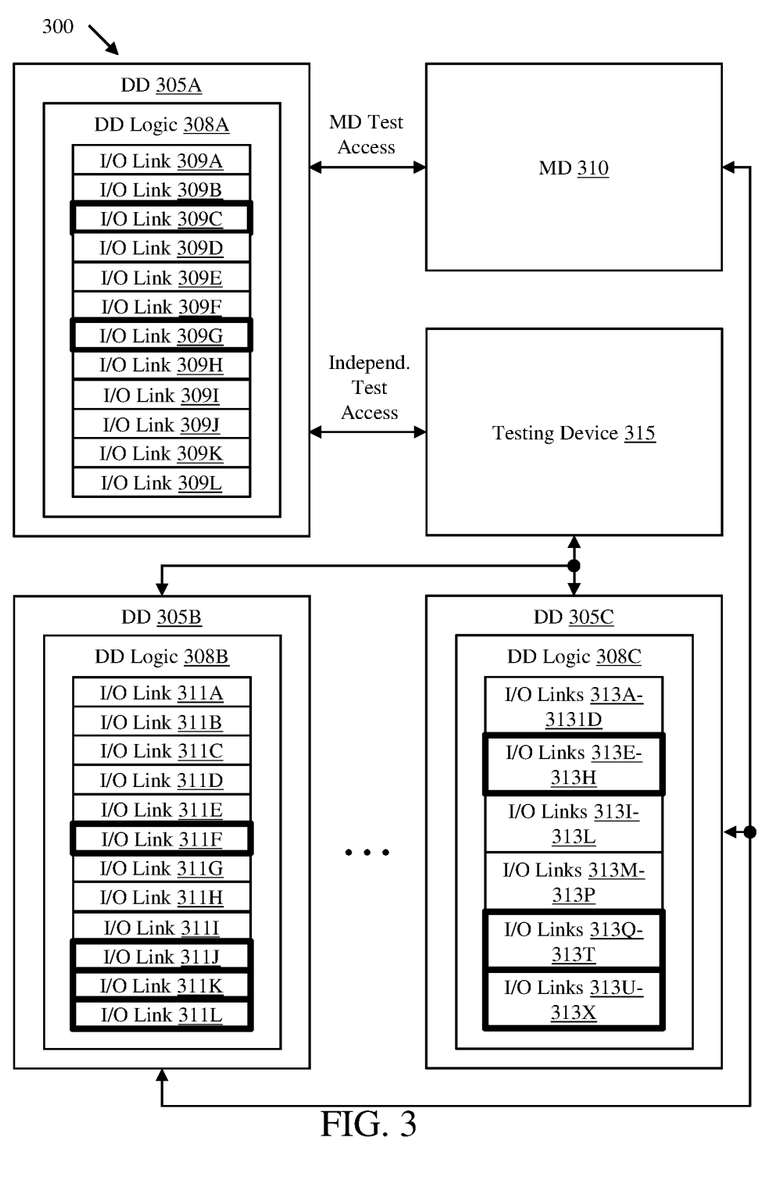
FIG. 3 is a block diagram of a system for reusing manufacturing content across MCPs, the system including different types of DDs, according to still other aspects of the present disclosure.

FIG. 3 is a block diagram of a system 300 for reusing manufacturing content across MCPs, the system 300 including different types of DDs 305, according to still other aspects of the present disclosure.

Referring to FIG. 3, the system 300 includes the DDs 305 and the MD 310 of an MCP, and a testing device 315. The DDs 305 may include a DD 305A, a DD 305B and a DD 305C. Although 3 DDs are shown, this is only an example, and the DDs 305 may include any number of DDs.

The DDs 305 respectively include DD logics 308. The DD logics 308 may include a DD logic 308A, a DD logic 308B and a DD logic 308C respectively corresponding to the DD 305A, the DD 305B and the DD 305C. Each of the DD logics 308 includes I/O links 309, 311 or 313, which can include semiconductor IP cores with I/O test pins accessible to the MD 310 and the testing device 315. In this example, each of the DD logics 308A and 308B may include 12 I/O links, and the DD logic 308C may include 24 I/O links in 6 groups of 4 I/O links. However, this is only an example, as each of the DD logics 308 can include any number of I/O links. As shown in FIG. 3, the DD logic 308A may include I/O links 309A to 309L, the DD logic 308B may include I/O links 311A to 311L and the DD logic 308C may include I/O links 313A to 313X.

In the DD logic 308A, the I/O link 309C and the I/O link 309G are downbonded out, as emphasized. In the DD logic 308B, the I/O link 311F, the I/O link 311J, the I/O link 311K and the I/O link 311L are downbonded out, as emphasized. In the DD logic 308C, the I/O links 313E to 313H, the I/O links 313Q to 313T and the I/O links 313U to 313X are downbonded out, as emphasized.

Based on receiving information of the above-described MCP under test, the testing device 315 may update a test pattern and a test response so that test pins or I/O links of the DDs 305 that are downbonded out are not mapped to any tester channel or removed from the test pattern and the test response. The testing device 315 may virtually mask these test pins or I/O links during loading of the created test pattern and/or by special test attributes during loading and initialization of a test program into the testing device 315. This masking scheme may not incur any vector memory penalty nor any recurring test time overhead. In this example, as the I/O links 309C and 309G of the DD 305A are downbonded out, and as the I/O links 311F, 311J, 311K and 311L of the DD 305B are downbonded out, the testing device 315 masks out corresponding portions of the created test pattern during the loading and initialization of the test program, by removing the portions from the created test program or marking the portions in the created test program so that the portions are not used for testing.

Table 2 shows the updated test pattern for the DD 305A and 305B. The test pattern is shown to execute on each of the DD 305A and 305B and on each set of the I/O links 309 and 311 in a respective one of the DDs 305A and 305B that are not masked out. The I/O links 309C and 309G of the DD 305A and the I/O links 311F, 311J, 311K and 311L of the DD 305B are masked out, as emphasized. Each of the I/O links 309 and 311 includes an input test pin for receiving a stimulus (e.g., the updated test pattern from the testing device 315), and an output test pin for sending a response back to the testing device 315.

TABLE 2

| | DD 305A Input Test Pin | DD 305A Output Test Pin | DD 305B Input Test Pin | DD 305B Output Test Pin |
|---|---|---|---|---|
| I/O Link A | 1 | H | 1 | H |
| I/O Link A | 1 | L | 1 | L |
| I/O Link B | 1 | H | 1 | H |
| I/O Link B | 1 | L | 1 | L |
| I/O Link C | 1 | H | 1 | H |
| I/O Link C | 1 | L | 1 | L |
| I/O Link D | 1 | H | 1 | H |
| I/O Link D | 1 | L | 1 | L |
| I/O Link E | 1 | H | 1 | H |
| I/O Link E | 1 | L | 1 | L |
| I/O Link F | 1 | H | 1 | H |
| I/O Link F | 1 | L | 1 | L |
| I/O Link G | 1 | H | 1 | H |
| I/O Link G | 1 | L | 1 | L |
| I/O Link H | 1 | H | 1 | H |
| I/O Link H | 1 | L | 1 | L |
| I/O Link I | 1 | H | 1 | H |
| I/O Link I | 1 | L | 1 | L |
| I/O Link J | 1 | H | 1 | H |
| I/O Link J | 1 | L | 1 | L |
| I/O Link K | 1 | H | 1 | H |
| I/O Link K | 1 | L | 1 | L |
| I/O Link L | 1 | H | 1 | H |
| I/O Link L | 1 | L | 1 | L |

There may be other types of DDs within the same MCP that can follow a similar virtual package-based universal test pattern that is updated at runtime during loading and initialization of the test program into the testing device 315. In this example, in the DD 305C, the lowest granularity of I/O link bondouts is 4 (quad). Accordingly, the testing device 315 creates and updates the test pattern and the test response at runtime at a quad-level resolution, namely, for a first group of the I/O links 313A to 313D, a second group of the I/O links 313E to 313H, a third group of the I/O links 3131 to 313L, a fourth group of the I/O links 313M to 313P, a fifth group of the I/O links 313Q to 313T and a sixth group of the I/O links 313U to 313X. Further, as the I/O links 313E to 313H, the I/O links 313Q to 313T and the I/O links 313U to 313X of the DD 305C are downbonded out, the testing device 315 masks out corresponding portions of the created test pattern during the loading and initialization of the test program.

Table 3 shows the updated test pattern for the DD 305C. The test pattern is shown to execute on the DD 305C and on each set of the I/O links 313 in the DD 305C that is not masked out. The I/O links 313E to 313H, the I/O links 313Q to 313T and the I/O links 313U to 313X of the DD 305C are masked out, as emphasized. Each of the I/O links 313 includes an input test pin for receiving a stimulus (e.g., the updated test pattern from the testing device 315), and an output test pin for sending a response back to the testing device 315.

TABLE 3

| | DD 305C Input Test Pin | DD 305C Output Test Pin |
|---|---|---|
| I/O Link A | 1 | H |
| I/O Link A | 1 | L |
| I/O Link B | 1 | H |
| I/O Link B | 1 | L |
| I/O Link C | 1 | H |
| I/O Link C | 1 | L |
| I/O Link D | 1 | H |
| I/O Link D | 1 | L |
| I/O Link E | 1 | H |
| I/O Link E | 1 | L |
| I/O Link F | 1 | H |
| I/O Link F | 1 | L |
| I/O Link G | 1 | H |
| I/O Link G | 1 | L |
| I/O Link H | 1 | H |
| I/O Link H | 1 | L |
| I/O Link I | 1 | H |
| I/O Link I | 1 | L |
| I/O Link J | 1 | H |
| I/O Link J | 1 | L |
| I/O Link K | 1 | H |
| I/O Link K | 1 | L |
| I/O Link L | 1 | H |
| I/O Link L | 1 | L |
| I/O Link M | 1 | H |
| I/O Link M | 1 | L |
| I/O Link N | 1 | H |
| I/O Link N | 1 | L |
| I/O Link O | 1 | H |
| I/O Link O | 1 | L |
| I/O Link P | 1 | H |
| I/O Link P | 1 | L |
| I/O Link Q | 1 | H |
| I/O Link Q | 1 | L |
| I/O Link R | 1 | H |
| I/O Link R | 1 | L |
| I/O Link S | 1 | H |
| I/O Link S | 1 | L |
| I/O Link T | 1 | H |
| I/O Link T | 1 | L |
| I/O Link U | 1 | H |
| I/O Link U | 1 | L |
| I/O Link V | 1 | H |
| I/O Link V | 1 | L |
| I/O Link W | 1 | H |
| I/O Link W | 1 | L |
| I/O Link X | 1 | H |
| I/O Link X | 1 | L |

Figure 4:
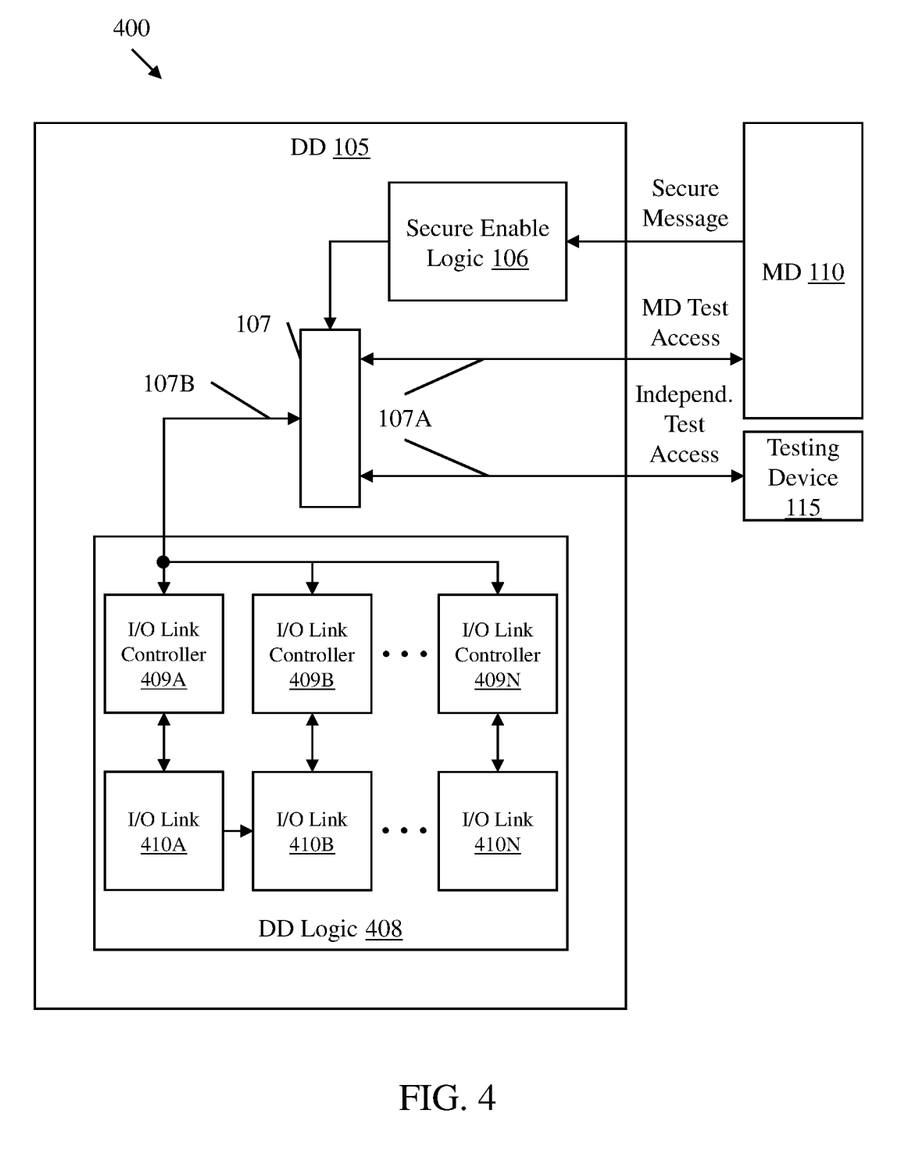
FIG. 4 is a block diagram of a system for reusing manufacturing content across MCPs, the system including a DD logic including I/O link controllers, according to yet other aspects of the present disclosure.

FIG. 4 is a block diagram of a system 400 for reusing manufacturing content across MCPs, the system 400 including a DD logic 408 including I/O link controllers 409, according to yet other aspects of the present disclosure.

Referring to FIG. 4, the system 400 includes the DD 105, the MD 110 and the testing device 115 of FIG. 1A, except the DD 105 includes the DD logic 408. Differing from the DD logic 108 of FIG. 1A, the DD logic 408 further includes the I/O link controllers 409 serially connected to I/O links 410, respectively. The I/O links 410 may include an I/O link 410A, an I/O link 410B, . . . and an I/O link 410N. Although 3 I/O links are shown, this is only an example, and the I/O links 410 may include any number of I/O links.

The I/O link controllers 409 may include an I/O link controller 409A, an I/O link controller 409B, . . . and an I/O link controller 409N. Although 3 I/O link controllers are shown, this is only an example, and the I/O link controllers 409 can include any number of I/O link controllers. Each of the I/O link controllers 409 may mask out a corresponding one of the I/O links 410 if the corresponding one of the I/O links 410 is downbonded out, and prevent transfer of a test pattern from the testing device 115 to the masked corresponding one of the I/O links 410 and of a test response from the masked corresponding one of the I/O links 410 to the testing device 115. Each of the I/O link controllers 409 can further receive the test pattern from the testing device 115, and control a timing at which a corresponding one of the I/O links 410 receives the received test pattern, based on a timing of the received test pattern. Accordingly, the I/O link controllers 409 may ensure that any of the I/O links 410 is properly masked out, even if the testing device 115 fails to properly mask out any of the I/O links 410 when updating the test pattern. The I/O link controllers 409 can further ensure that the I/O links 410 properly receive the test pattern at a proper time as intended by the testing device 115.

Figure 5:
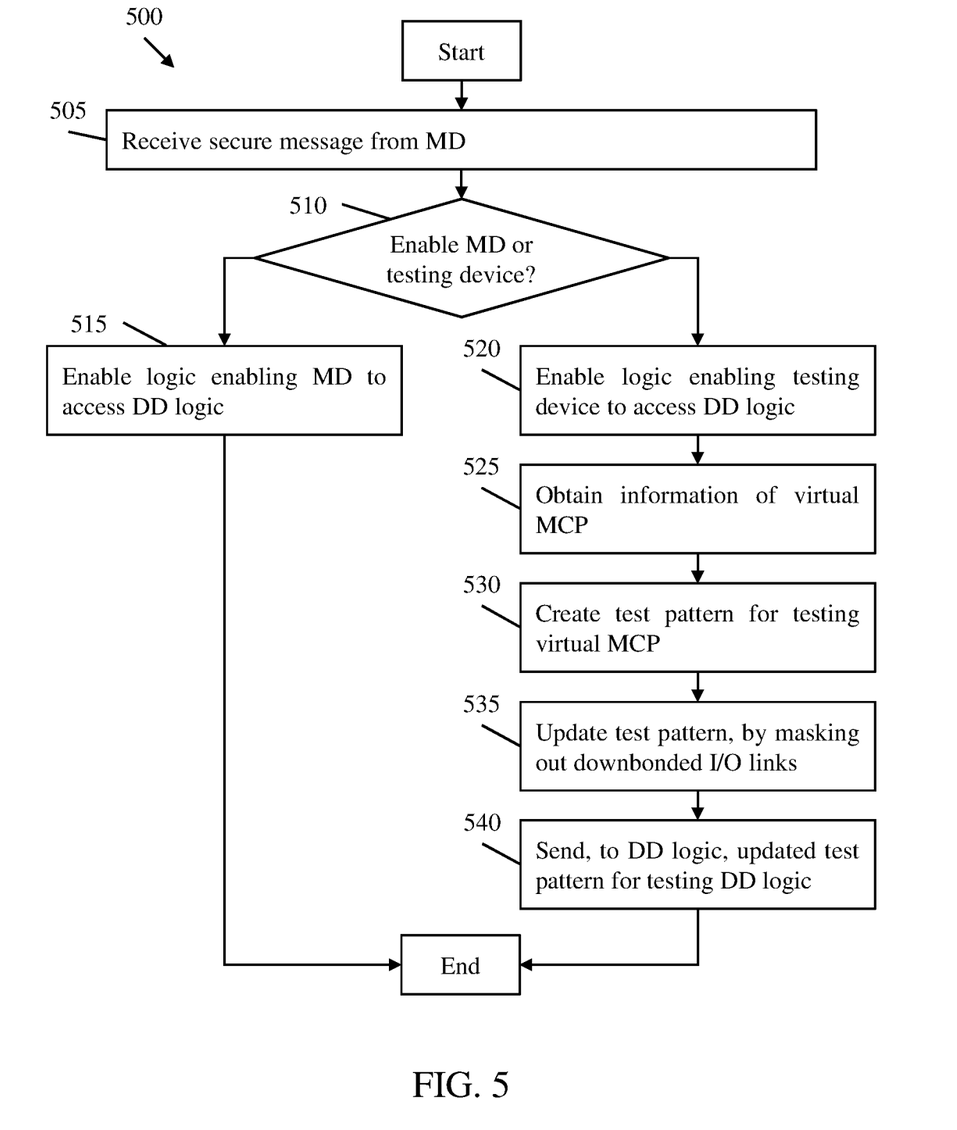
FIG. 5 is a flow diagram of a method of reusing manufacturing content across MCPs, according to aspects of the present disclosure.

FIG. 5 is a flow diagram of a method 500 of reusing manufacturing content across MCPs, according to aspects of the present disclosure.

Referring to FIGS. 1A and 5, operation 505 may be directed to the secure enable logic 106 receiving a secure message from the MD 110.

Operation 510 may be directed to the secure enable logic 106, based on the received secure message, determining whether the MD 110 or the testing device 115 is enabled to access the DD logic 108. Based on the MD 110 being determined to be enabled to access the DD logic 108, the method 500 continues in operation 515. Otherwise, the method 500 continues in operation 520.

Operation 515 may be directed to the secure enable logic 106 controlling the arbitrator 107 to enable the MD 110 to access the DD logic 108 via the MD test access.

Operation 520 may be directed to the secure enable logic 106 controlling the arbitrator 107 to enable the testing device 115 to access the DD logic 108 via the independent test access.

Operation 525 may be directed to the testing device 115 obtaining, from a user and/or a test program, information of a virtual MCP including n DDs, in which one or more I/O links of the DD logic 108 are downbonded out. The obtaining the information of the virtual MCP may be performed based on the testing device 115 being enabled to access the DD logic 108. The information of the virtual MCP may include, for example, information of the MD 110, of each of the DDs (e.g., a total number of the DDs), and of each of I/O links included in the DDs (e.g., a total number of the I/O links and a number of the I/O links that are downbonded out).

Operation 530 may be directed to the testing device 115 creating a test pattern for testing the virtual MCP, based on the obtained information of the virtual MCP.

Operation 535 may be directed to the testing device 115 updating the created test pattern by masking out, in the created test pattern, the one or more I/O links of the DD logic 108 that are downbonded out. The masking the one or more I/O links can include removing, from the created test pattern, portions corresponding to the unused one or more I/O links, or marking the portions in the created test pattern so that the portions are not used for testing DD logic 108.

Operation 540 may be directed to the testing device 115 sending, to the DD logic 108 via the independent test access, the updated test pattern for testing the DD logic 108.

The methods and sequence of steps presented above are intended to be examples for reusing manufacturing content across MCPs, according to the present disclosure. It will be apparent to those ordinary skilled practitioners that the foregoing process operations may be modified without departing from the spirit of the present disclosure.

Figure 6:
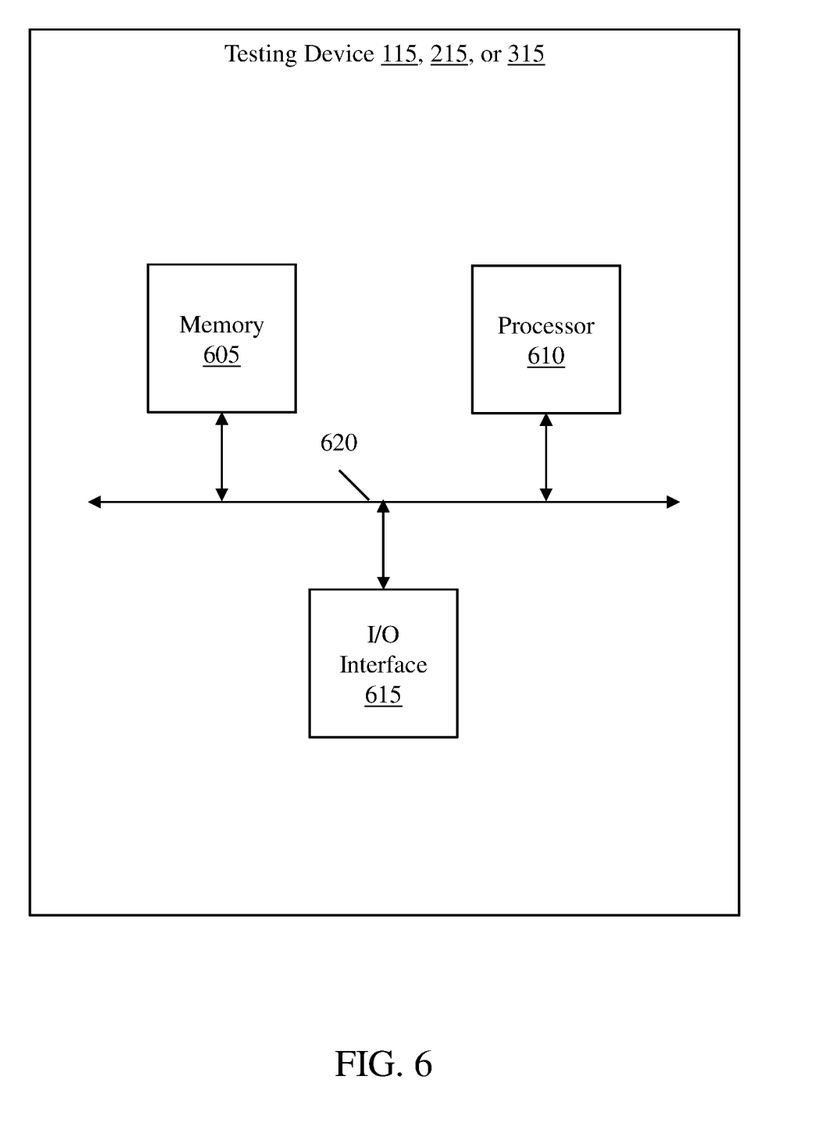
FIG. 6 shows a block diagram of a testing device of FIG. 1A, a testing device of FIG. 2 or a testing device of FIG. 3.

FIG. 6 shows a block diagram of the testing device 115 of FIG. 1A, the testing device 215 of FIG. 2 or the testing device 315 of FIG. 3.

Referring to FIG. 6, each of the testing device 115, the testing device 215 and the testing device 315 may include a memory 605, a processor 610, an input/output (I/O) interface 615 and a bus 620.

The memory 605 may include a volatile and/or non-volatile memory. The memory 605 can store information, such as one or more of commands, data, programs (one or more instructions), applications, etc., which are related to at least one other component of the testing device and for driving and controlling the testing device. For example, commands and/or data may formulate an operating system (OS). Information stored in the memory 605 can be executed by the processor 610. The memory 605 may store the information that is executed by the processor 610 to perform functions and operations described with respect to FIGS. 1A-5 above.

The processor 610 may include one or more of a central processing unit (CPU), a graphics processor unit (GPU), an accelerated processing unit (APU), a many integrated core (MIC), a field-programmable gate array (FPGA), and/or a digital signal processor (DSP). The processor 610 can be a general-purpose controller that performs control of any one or any combination of the other components of the testing device, and/or performs an operation or data processing relating to communication. The processor 610 may execute one or more programs stored in the memory 605.

The I/O interface 615 may serve as a hardware and/or software interface that can, for example, transfer commands and/or data between a user, other external devices and/or other components of the testing device. The I/O interface 615 can further set up communication between the testing device and an external testing device. The I/O interface 615 may be connected to a network through wireless or wired communication architecture to communicate with the external testing device. The I/O interface 615 may be a wired or wireless transceiver or any other component for transmitting and receiving signals.

The bus 620 may include a circuit for connecting the components 605, 610 and 615 with one another. The bus 620 functions as a communication system for transferring data between the components 605, 610 and 615 or between testing devices.

To more readily understand and put into practical effect the present apparatuses and methods, particular aspects will now be described by way of examples. For the sake of brevity, duplicate descriptions of features and properties may be omitted.

EXAMPLES

Example 1 provides an apparatus including a daughter die (DD) logic, and an arbitrator connected to the DD logic, and connected to an external testing device and a main die (MD) included in a multi-chip package (MCP). The apparatus further includes an enable logic configured to receive a message from the MD, based on the received message, determine whether the MD or the external testing device is enabled to access the DD logic, and based on the external testing device being determined to be enabled to access the DD logic, control the arbitrator to enable the external testing device to access the DD logic.

Example 2 may include the apparatus of example 1 and/or any other example disclosed herein, for which the enable logic may be further configured to, based on MD being determined to be enabled to access the DD logic, control the arbitrator to enable the MD to access the DD logic.

Example 3 may include the apparatus of example 1 and/or any other example disclosed herein, for which the enable logic may not be accessible to external users.

Example 4 may include the apparatus of example 1 and/or any other example disclosed herein, for which the DD logic may be configured to, based on the arbitrator being controlled to enable the external testing device to access the DD logic, receive a test pattern for testing the DD logic, from the external testing device via the arbitrator, and send a test response to the external testing device via the arbitrator.

Example 5 may include the apparatus of example 4 and/or any other example disclosed herein, for which the DD logic may include one or more input/output (I/O) links including semiconductor intellectual property (IP) cores configured to receive the test pattern from the external testing device.

Example 6 may include the apparatus of example 5 and/or any other example disclosed herein, for which the DD logic may further include one or more I/O link controllers respectively connected to the one or more I/O links.

Example 7 may include the apparatus of example 6 and/or any other example disclosed herein, for which each of the one or more I/O link controllers may be configured to mask a corresponding one of the I/O links that is unused, and prevent transfer of the test pattern from the external testing device to the masked corresponding one of the I/O links and of the test response from the masked corresponding one of the I/O links to the external testing device.

Example 8 may include the apparatus of example 6 and/or any other example disclosed herein, for which each of the one or more I/O link controllers may be configured to receive the test pattern from the external testing device, and control a timing at which a corresponding one of the I/O links receives the received test pattern, based on a timing of the received test pattern.

Example 9 provides an apparatus including a processor configured to, based on the apparatus being enabled to access a daughter die (DD) logic of one of DDs included in a multi-chip package (MCP), obtain information of the MCP in which one or more input/output (I/O) links included in the DD logic are unused, and create a test pattern for testing the MCP, based on the obtained information of the MCP. The processor is further configured to update the created test pattern by masking, in the created test pattern, the unused one or more I/O links, and send, to the DD logic, the updated test pattern for testing the DD logic.

Example 10 may include the apparatus of example 9 and/or any other example disclosed herein, for which the information of the MCP may be obtained from a user and/or a test program that is loaded into the apparatus.

Example 11 may include the apparatus of example 9 and/or any other example disclosed herein, for which the information of the MCP may include information of a main die (MD) included in the MCP, of each of the DDs, and of each of at least one I/O link included in the DDs.

Example 12 may include the apparatus of example 9 and/or any other example disclosed herein, for which the processor may be further configured to receive, from the DD logic, a test response in response to the sent test pattern, and update the received test response by masking, in the received test response, the unused one or more I/O links.

Example 13 may include the apparatus of example 9 and/or any other example disclosed herein, for which the unused one or more I/O links may be masked by removing, from the created test pattern, portions corresponding to the unused one or more I/O links, or marking the portions in the created test pattern so that the portions are not used for testing DD logic.

Example 14 provides a method including receiving, by a daughter die (DD) included in a multi-chip package (MCP), a message from a main die (MD) included in the MCP, and based on the received message, determining, by the DD, whether the MD or an external testing device is enabled to access a DD logic included in the DD. The method further includes, based on the external testing device being determined to be enabled to access the DD logic, enabling, by the DD, the external testing device to access the DD logic.

Example 15 may include the method of example 14 and/or any other example disclosed herein, further including, based on MD being determined to be enabled to access the DD logic, enabling, by the DD, the MD to access the DD logic.

Example 16 may include the method of example 14 and/or any other example disclosed herein, further including, based on the external testing device being enabled to access the DD logic, receiving, by the DD, a test pattern for testing the DD logic, from the external testing device, and sending a test response to the external testing device.

Example 17 may include the method of example 16 and/or any other example disclosed herein, further including masking, by the DD, an unused one of input/output (I/O) links included in the DD logic, and preventing transfer of the test pattern from the external testing device to the masked unused one of the I/O links and of the test response from the masked corresponding one of the I/O links to the external testing device.

Example 18 may include the method of example 16 and/or any other example disclosed herein, further including controlling, by the DD, a timing at which each of I/O links included in the DD logic receives the test pattern, based on a timing of the test pattern.

Example 19 may include the method of example 14 and/or any other example disclosed herein, further including based on the external testing device being enabled to access the DD logic, obtaining, by the external testing device, information of the MCP in which one or more input/output (I/O) links included in the DD logic are unused, and creating, by the external testing device, a test pattern for testing the MCP, based on the obtained information of the MCP. The method further includes updating, by the external testing device, the created test pattern by masking, in the created test pattern, the unused one or more I/O links, and sending, by the external testing device, to the DD logic, the updated test pattern for testing the DD logic.

Example 20 may include the method of example 19 and/or any other example disclosed herein, further including receiving, by the external testing device, from the DD logic, a test response in response to the sent test pattern, and updating, by the external testing device the received test response by masking, in the received test response, the unused one or more I/O links.

Example 21 provides an apparatus including obtaining means for, based on the apparatus being enabled to access a daughter die (DD) logic of one of DDs included in a multi-chip package (MCP), obtaining information of the MCP in which one or more input/output (I/O) links included in the DD logic are unused, and creating means for creating a test pattern for testing the MCP, based on the obtained information of the MCP. The apparatus further includes updating means for updating the created test pattern by masking, in the created test pattern, the unused one or more I/O links, and sending means for sending, to the DD logic, the updated test pattern for testing the DD logic.

Example 22 may include the apparatus of example 21 and/or any other example disclosed herein, for which the information of the MCP may include information of a main die (MD) included in the MCP, of each of the DDs, and of each of at least one I/O link included in the DDs.

Example 23 provides a non-transitory computer-readable medium may include instructions, which, if executed by a processor, cause the processor to, based on the processor being enabled to access a daughter die (DD) logic of one of DDs included in a multi-chip package (MCP), obtain information of the MCP in which one or more input/output (I/O) links included in the DD logic are unused, and create a test pattern for testing the MCP, based on the obtained information of the MCP. The instructions, which, if executed by the processor, further cause the processor to update the created test pattern by masking, in the created test pattern, the unused one or more I/O links, and send, to the DD logic, the updated test pattern for testing the DD logic.

Example 24 may include the non-transitory computer-readable medium of example 23 and/or any other example disclosed herein, for which the information of the MCP may include information of a main die (MD) included in the MCP, of each of the DDs, and of each of at least one I/O link included in the DDs.

It will be understood that any property described herein for a specific device may also hold for any device described herein. It will also be understood that any property described herein for a specific method may hold for any of the methods described herein. Furthermore, it will be understood that for any device or method described herein, not necessarily all the components or operations described will be enclosed in the device or method, but only some (but not all) components or operations may be enclosed.

The term "comprising" shall be understood to have a broad meaning similar to the term "including" and will be understood to imply the inclusion of a stated integer or operation or group of integers or operations but not the exclusion of any other integer or operation or group of integers or operations. This definition also applies to variations on the term "comprising" such as "comprise" and "comprises".

The term "coupled" (or "connected") herein may be understood as electrically coupled or as mechanically coupled, e.g., attached or fixed or attached, or just in contact without any fixation, and it will be understood that both direct coupling or indirect coupling (in other words: coupling without direct contact) may be provided.

The methods described herein may be performed and the various processing or computation units and the devices and computing entities described herein may be implemented by one or more circuits. In an embodiment, a "circuit" may be understood as any kind of a logic implementing entity, which may be hardware, software, firmware, or any combination thereof. Thus, in an embodiment, a "circuit" may be a hard-wired logic circuit or a programmable logic circuit such as a programmable processor, e.g., a microprocessor. A "circuit" may also be software being implemented or executed by a processor, e.g., any kind of computer program, e.g., a computer program using a virtual machine code. Any other kind of implementation of the respective functions that are described herein may also be understood as a "circuit" in accordance with an alternative embodiment.

While the present disclosure has been particularly shown and described with reference to specific aspects, it should be understood by those skilled in the art that various changes in form and detail may be made therein without departing from the spirit and scope of the present disclosure as defined by the appended claims. The scope of the present disclosure is thus indicated by the appended claims and all changes which come within the meaning and range of equivalency of the claims are therefore intended to be embraced.

What is claimed is:

1. An apparatus comprising:
    a daughter die (DD) logic;
    an arbitrator connected to the DD logic, to an external testing device, and to a main die (MD), wherein the MD is comprised in a multi-chip package (MCP); and
    an enable logic configured to:
        receive a message from the MD;
        determine, based on the received message, whether the MD or the external testing device is to be allowed to access the DD logic; and
        control, based on the external testing device being determined to be allowed access to the DD logic, the arbitrator to enable access by the external testing device to the DD logic.

2. The apparatus of claim 1, wherein the enable logic is further configured to, based on MD being determined to be allowed access the DD logic, control the arbitrator to enable access by the MD to the DD logic.

3. The apparatus of claim 1, wherein the enable logic is not accessible to external users.

4. The apparatus of claim 1, wherein the DD logic is configured to, based on the arbitrator being controlled to enable access by the external testing device to the DD logic, receive a test pattern for testing the DD logic, from the external testing device via the arbitrator, and send a test response to the external testing device via the arbitrator.

5. The apparatus of claim 4, wherein the DD logic comprises one or more input/output (I/O) links comprising semiconductor intellectual property (IP) cores configured to receive the test pattern from the external testing device.

6. The apparatus of claim 5, wherein the DD logic further comprises one or more I/O link controllers respectively connected to the one or more I/O links.

7. The apparatus of claim 6, wherein each of the one or more I/O link controllers is configured to mask a corresponding one of the I/O links that is unused, and prevent transfer of the test pattern from the external testing device to the masked corresponding one of the I/O links and of the test response from the masked corresponding one of the I/O links to the external testing device.

8. The apparatus of claim 6, wherein each of the one or more I/O link controllers is configured to receive the test pattern from the external testing device, and control a timing at which a corresponding one of the I/O links receives the received test pattern, based on a timing of the received test pattern.

9. An apparatus comprising:
    a processor configured to:
        based on the apparatus being enabled to access a daughter die (DD) logic of one of DDs comprised in a multi-chip package (MCP), obtain information of the MCP in which one or more input/output (I/O) links comprised in the DD logic are unused;
        create a test pattern for testing the MCP, based on the obtained information of the MCP;

update the created test pattern by masking, in the created test pattern, the unused one or more I/O links; and send, to the DD logic, the updated test pattern for testing the DD logic.

10. The apparatus of claim 9, wherein the information of the MCP is obtained from a user and/or a test program that is loaded into the apparatus.

11. The apparatus of claim 9, wherein the information of the MCP comprises information of a main die (MD) comprised in the MCP, of each of the DDs, and of each of at least one I/O link comprised in the DDs.

12. The apparatus of claim 9, wherein the processor is further configured to receive, from the DD logic, a test response in response to the sent test pattern, and update the received test response by masking, in the received test response, the unused one or more I/O links.

13. The apparatus of claim 9, wherein the unused one or more I/O links are masked by removing, from the created test pattern, portions corresponding to the unused one or more I/O links, or marking the portions in the created test pattern so that the portions are not used for testing DD logic.

14. A method comprising:
receiving, by a daughter die (DD) comprised in a multi-chip package (MCP), a message from a main die (MD) comprised in the MCP;

determining by the DD, based on the received message, whether the MD or an external testing device is to be allowed to access a DD logic comprised in the DD; and enabling by the DD, based on the external testing device being determined to allow access to the DD logic, the external testing device to access the DD logic.

15. The method of claim 14, further comprising, enabling by the DD, based on the MD being determined to allow access to the DD logic, the MD to access the DD logic.

16. The method of claim 14, further comprising:
receiving by the DD, based on the external testing device being enabled to access the DD logic, a test pattern for testing the DD logic, from the external testing device; and sending a test response to the external testing device.

17. The method of claim 16, further comprising:
masking, by the DD, an unused one of input/output (I/O) links comprised in the DD logic; and preventing transfer of the test pattern from the external testing device to the masked unused one of the I/O links and of the test response from the masked corresponding one of the I/O links to the external testing device.

18. The method of claim 16, further comprising controlling, by the DD, a timing at which each of I/O links comprised in the DD logic receives the test pattern, based on a timing of the test pattern.

19. The method of claim 14, further comprising:
obtaining by the external testing device, based on the external testing device being enabled to access the DD logic, information of the MCP in which one or more input/output (I/O) links comprised in the DD logic are unused;

creating, by the external testing device, a test pattern for testing the MCP, based on the obtained information of the MCP;

updating, by the external testing device, the created test pattern by masking, in the created test pattern, the unused one or more I/O links; and sending, by the external testing device, to the DD logic, the updated test pattern for testing the DD logic.

20. The method of claim 19, further comprising receiving, by the external testing device, from the DD logic, a test response in response to the sent test pattern, and updating, by the external testing device the received test response by masking, in the received test response, the unused one or more I/O links.

* * * * *